United States Patent
Furman et al.

(10) Patent No.: US 7,834,442 B2
(45) Date of Patent: Nov. 16, 2010

(54) ELECTRONIC PACKAGE METHOD AND STRUCTURE WITH CURE-MELT HIERARCHY

(75) Inventors: Bruce K Furman, Poughquag, NY (US); Kenneth C Marston, Poughquag, NY (US); Jiantao Zheng, Beacon, NY (US); Jeffrey A Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 216 days.

(21) Appl. No.: 11/954,943

(22) Filed: Dec. 12, 2007

(65) Prior Publication Data

US 2009/0179322 A1 Jul. 16, 2009

(51) Int. Cl.
*H01L 23/12* (2006.01)
(52) U.S. Cl. .................. 257/704; 257/E23.101
(58) Field of Classification Search .......... 438/112; 257/704, E23.101
See application file for complete search history.

(56) References Cited

U.S. PATENT DOCUMENTS

| | | | |
|---|---|---|---|
| 4,034,468 A | 7/1977 | Koopman | |
| 4,034,469 A | 7/1977 | Koopman et al. | |
| 4,081,825 A | 3/1978 | Koopman et al. | |
| 4,115,619 A | 9/1978 | Kurfman et al. | |
| 4,193,530 A | 3/1980 | Holmes | |
| 4,211,822 A | 7/1980 | Kurfman et al. | |
| 4,453,104 A | 6/1984 | Rapps et al. | |
| 4,524,497 A | 6/1985 | Rapps et al. | |
| 5,072,331 A | 12/1991 | Thiele et al. | |
| 5,097,387 A | 3/1992 | Griffith | |
| 5,154,341 A | 10/1992 | Melton et al. | |
| 5,233,504 A | 8/1993 | Melton et al. | |
| 5,325,265 A | 6/1994 | Turlik et al. | |
| 5,413,489 A * | 5/1995 | Switky | 439/71 |
| 5,621,225 A | 4/1997 | Shieh et al. | |
| 5,652,466 A | 7/1997 | Hirakawa et al. | |
| 5,780,321 A | 7/1998 | Shieh et al. | |
| 5,812,571 A | 9/1998 | Peters | |
| 5,827,102 A | 10/1998 | Watkins et al. | |
| 5,856,858 A | 1/1999 | Carey et al. | |
| 5,900,673 A | 5/1999 | Nishi et al. | |
| 5,909,160 A | 6/1999 | Dick et al. | |
| 5,923,086 A | 7/1999 | Winer et al. | |
| 5,940,683 A | 8/1999 | Holm et al. | |

(Continued)

*Primary Examiner*—W. David Coleman
*Assistant Examiner*—Christine Enad
(74) *Attorney, Agent, or Firm*—Gibb I.P. Law Firm, LLC; Joseph Petrokaitis, Esq.

(57) ABSTRACT

Disclosed herein are embodiments of electronic package incorporating a thermal interface material (e.g., a metal TIM) that is positioned between a lid and a chip on a substrate. The TIM has a predetermined (i.e., repeatable) minimum thickness and is further registered to the top surface of the chip (i.e., the TIM has an essentially symmetric shape and does not extend vertically along the sidewalls of the chip). Also, disclosed herein are embodiments of a method of forming such an electronic package that uses a hierarchical heating process that cures a lid sealant, thereby securing the lid to the substrate, and then reflows (i.e., melts and cools) the TIM, thereby adhering the TIM to both the chip and lid. This hierarchical heating process ensures that the TIM has the above-mentioned characteristics (i.e., a predetermined minimum thickness and registration to the top surface of the chip) and further provides robust process windows for high-yield, low-cost electronic package manufacturing.

20 Claims, 9 Drawing Sheets

U.S. PATENT DOCUMENTS

| | | |
|---|---|---|
| 6,045,030 A | 4/2000 | Ramer et al. |
| 6,063,506 A | 5/2000 | Andricacos et al. |
| 6,090,710 A | 7/2000 | Andricacos et al. |
| 6,211,463 B1 | 4/2001 | Fabis |
| 6,259,159 B1 | 7/2001 | Dalal et al. |
| 6,294,408 B1 * | 9/2001 | Edwards et al. ............. 438/121 |
| 6,344,234 B1 | 2/2002 | Dalal et al. |
| 6,442,304 B1 | 8/2002 | Crawley et al. |
| 6,461,891 B1 | 10/2002 | Dishongh et al. |
| 6,504,242 B1 | 1/2003 | Deppisch et al. |
| 6,630,783 B1 | 10/2003 | Ono |
| 6,653,741 B2 | 11/2003 | Sreeram et al. |
| 6,670,599 B2 | 12/2003 | Wagner et al. |
| 6,710,369 B1 | 3/2004 | Travis |
| 6,793,829 B2 | 9/2004 | Platt et al. |
| 6,879,014 B2 | 4/2005 | Wagner et al. |
| 6,882,043 B2 | 4/2005 | Dishongh et al. |
| 7,005,667 B2 | 2/2006 | Chen et al. |
| 7,005,787 B2 | 2/2006 | Hsiao et al. |
| 7,061,086 B2 | 6/2006 | Ferreiro et al. |
| 7,111,771 B2 | 9/2006 | Hua |
| 7,132,721 B2 | 11/2006 | Platt et al. |
| 7,148,560 B2 * | 12/2006 | Lee et al. .................... 257/667 |
| 7,678,615 B2 * | 3/2010 | Touzelbaev et al. ......... 438/122 |
| 2006/0261467 A1 | 11/2006 | Colgan et al. |
| 2007/0175621 A1 | 8/2007 | Datta et al. |
| 2007/0184582 A1 * | 8/2007 | Nakamura et al. .......... 438/108 |
| 2008/0242002 A1 * | 10/2008 | Colgan et al. ............... 438/118 |
| 2009/0001557 A1 * | 1/2009 | Renavikar et al. ........... 257/712 |
| 2009/0057884 A1 * | 3/2009 | Too et al. .................... 257/723 |

* cited by examiner

ELECTRONIC PACKAGE METHOD AND STRUCTURE WITH CURE-MELT HIERARCHY

BACKGROUND

1. Field of the Invention

The embodiments of the invention generally relate to electronic packages and, more particularly, to an electronic package structure and method of forming the structure with a metal thermal interface material that is has predetermined minimum thickness and that is registered to the top surface of the chip.

2. Description of the Related Art

Currently, electronic packages (e.g., chip packages, die packages, semiconductor modules, etc.) incorporate various different features to remove or dissipate heat from a chip (e.g., from a die, an integrated circuit, etc.) For example, a chip can be mounted on a substrate (e.g., a chip carrier) and a lid (e.g., a cooling structure or structure capable of dissipating heat) can be placed over the chip. The lid can be connected to the substrate by a sealant (e.g., an epoxy or elastomer adhesive) and the gap between the chip and the lid can be filled with a thermal interface material (TIM) for promoting heat conduction between the chip and the lid. Typical TIMs include thermal greases, thermal gels, and thermal pastes. However, due to their conductive properties, metal TIMs are preferable. Unfortunately, robust process windows for achieving a reliable and repeatable metal TIM-based chip package currently do not exist. Therefore, there is a need in the art for an improved electronic package structure as well as a method of forming the structure that incorporates a metal TIM.

SUMMARY

Disclosed is an embodiment of a chip package. This chip package comprises a substrate, a chip, a lid, a sealant and a thermal interface material. Specifically, the chip has a bottom surface connected to the substrate, a top surface opposite the bottom surface and sidewalls. The lid is above the top surface of the chip. The lid and the substrate each comprise outer edges that extend laterally beyond the chip and the sealant, which is cured, connects the outer edges of the lid to the outer edges of the substrate. The thermal interface material is positioned between and is adhered to both the lid and the top surface of the chip. This thermal interface material has a predetermined minimum thickness, has an essentially symmetric shape and does not extend vertically along the sidewalls of the chip. Finally, the cure temperature of the sealant is less than the reflow temperature of the thermal interface material.

Also disclosed is another embodiment of a chip package. This chip package comprises a substrate, a chip, a lid, a thermoset sealant and a thermal interface material. Specifically, the chip has a bottom surface connected to the substrate, a top surface opposite the bottom surface, and sidewalls. The lid is above the top surface of the chip. The lid and substrate each comprise outer edges extending laterally beyond the chip and the thermoset sealant, which is melted, re-shaped and cured, connects the outer edges of the lid to the outer edges of the substrate. The thermal interface material is positioned between and is adhered to both the lid and the top surface of the chip. This thermal interface material has a predetermined minimum thickness, has an essentially symmetric shape and does not extend vertically along the sidewalls of the chip. Finally, the cure temperature of the thermoset sealant is less than the reflow temperature of the thermal interface material.

Disclosed is an embodiment of a method of forming a chip package. The method comprises providing a chip having a bottom surface, a top surface opposite the bottom surface and sidewalls. The bottom surface of the chip is connected to a substrate and a thermal interface material is placed on either the top surface of the chip or an inner surface of a lid. A sealant, having a cure temperature that is less than the reflow temperature of the thermal interface material, is dispensed onto the outer edges of the lid and/or the substrate. The lid is positioned above the top surface of the chip such that the sealant wets the outer edges of both the lid and the substrate and further such that the thermal interface material is positioned between the lid and the top surface of the chip. Finally, a hierarchical heating process is performed in order to cure the sealant and to reflow the thermal interface material. This hierarchical heating process comprises first heating the chip package to a first predetermined temperature that is above the cure temperature of the sealant, but that is below the reflow temperature of the thermal interface material. The chip package is maintained at this first predetermined temperature until the sealant is cured. After the sealant is cured, the chip package is heated to a second predetermined temperature that is higher than the first predetermined temperature and that is at least equal to the reflow temperature of the thermal interface material. After reflow of the thermal interface material, the chip package is cooled to below the second predetermined temperature.

Also disclosed is another embodiment of a method forming a chip package. The method comprises providing a chip having a bottom surface, a top surface opposite the bottom surface and sidewalls. The bottom surface of the chip is connected to a substrate and a thermal interface material is placed on either the top surface of the chip or an inner surface of a lid. A pre-formed thermoset sealant, having a cure temperature that is less than the reflow temperature of the thermal interface material, is placed on the outer edges of the lid and/or substrate. The lid is positioned above the top surface of the chip such that the sealant contacts the outer edges of both the lid and the substrate and further such that the thermal interface material is positioned between the lid and the top surface of the chip. Finally, a hierarchical heating process is performed in order to melt, re-shape and cure the sealant and to reflow the thermal interface material. This hierarchical heating process comprises first heating the chip package to a first predetermined temperature above the cure temperature of the sealant, but below the reflow temperature of the thermal interface material. The chip package is maintained at the first predetermined temperature until the sealant is cured. After the sealant is cured, the chip package is heated to a second predetermined temperature that is higher than the first predetermined temperature and that is at least equal to the reflow temperature of the thermal interface material. After reflow of the thermal interface material, the chip package is cooled to below the second predetermined temperature.

BRIEF DESCRIPTION OF THE DRAWINGS

The embodiments of the invention will be better appreciated and understood from the following detailed description with reference to the accompanying drawings, in which.

DETAILED DESCRIPTION OF EMBODIMENTS

Figure 1:
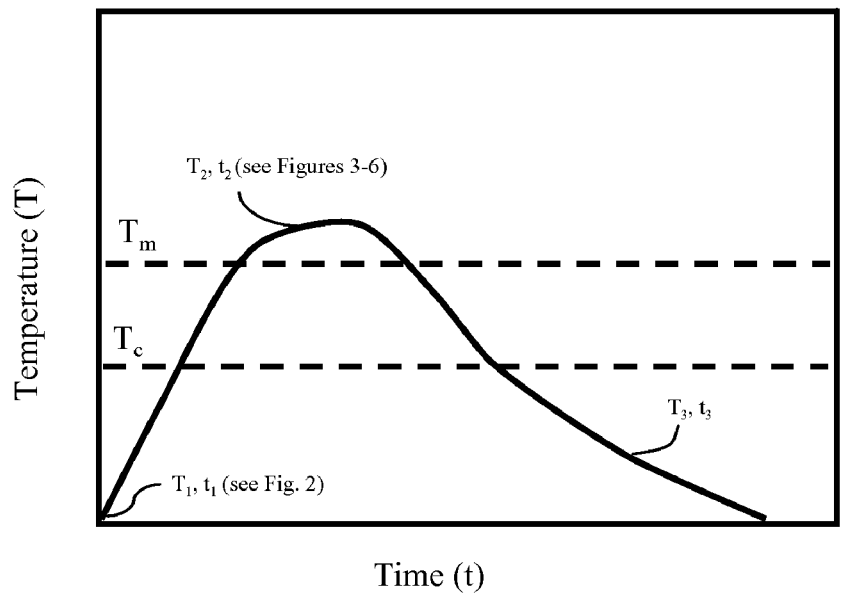
FIG. 1 is a cross-section diagram illustrating a chip package.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, electronic packages (e.g., chip packages, die packages, semiconductor modules, etc.) incorporate various different features to remove or dissipate heat from a chip (e.g., from a die, an integrated circuit, etc.). For example, in one such chip package, a chip can be mounted on an organic laminate substrate (e.g., a chip carrier) and a lid (e.g., a cooling structure or structure capable of dissipating heat) can be placed over the chip. The lid can be connected to the substrate with a sealant and the gap between the chip and the lid can be filled with a thermal interface material (TIM) that promotes heat conduction between the chip and the lid. Typical TIMs include thermal greases, thermal gels, and thermal pastes. However, due to their conductive properties, metal TIMs are preferable. Unfortunately, robust process windows for achieving a reliable and repeatable metal TIM-based chip package currently do not exist.

Figure 2:
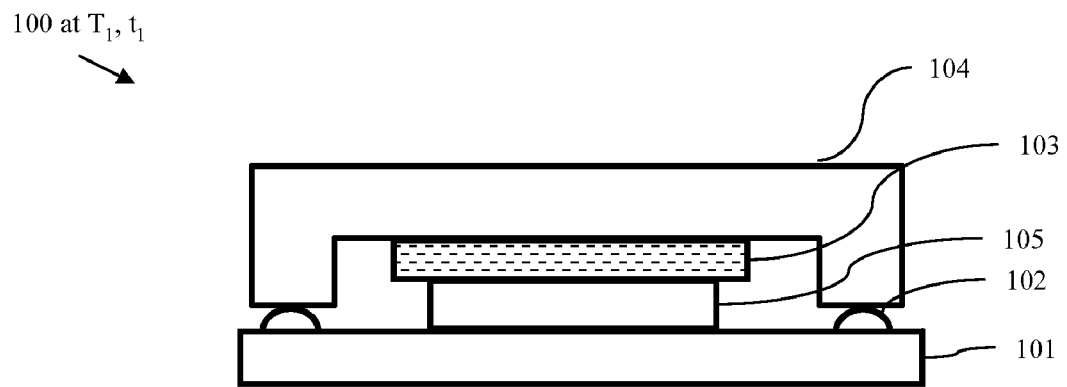
FIG. 2 is a graph illustrating a heating process used in forming the chip package of FIG. 1.

More specifically, current metal TIM-based chip package assembly processes include a heating process that is used to simultaneously cure (i.e., permanently harden) a liquid-dispensed sealant (e.g., a silicon-based elastomer sealant) in order to secure the lid to the substrate and reflow (i.e., melt) the metal TIM (e.g., indium or an indium alloy) in order to adhere the metal TIM to both the chip and the lid (once the structure is cooled. FIG. 1 illustrates such a heating process. Specifically, the reflow or melting temperature ($T_m$) of the metal TIM is greater than the cure temperature ($T_c$) of the sealant used to seal the lid to the substrate. At an initial time ($t_1$) and temperature ($T_1$) that is below the cure temperature ($T_c$) of the sealant 102, a piece of metal foil 103 (i.e., the TIM material) is place either on the top surface of the chip 105 opposite the substrate 101 or on the inner surface of the lid 104 (see also FIG. 2). Additionally, a liquid sealant 102 is dispensed on the outer edges of the lid 104 and/or the outer edges of the substrate 101. The lid 104 is then positioned above the chip 105 such that the sealant 102 wets both the lid 104 and the substrate 101 and further such that the piece of metal foil 103 is positioned between the chip 105 and the lid 104, thereby, forming the initial chip package 100.

Figure 3:
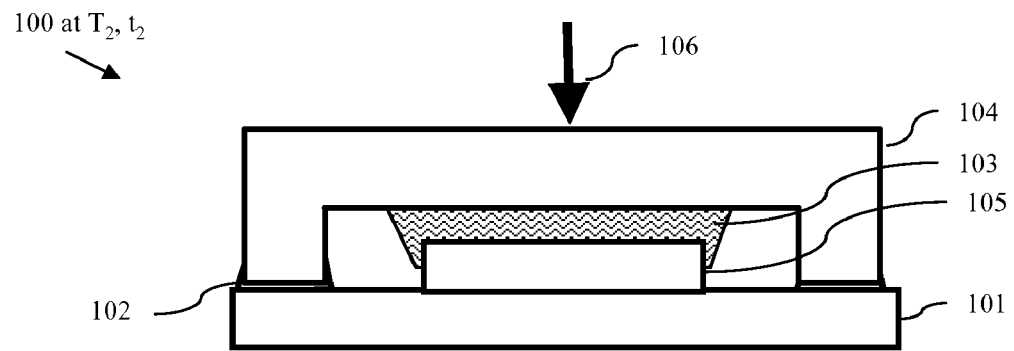
FIG. 3 is a cross-section diagram illustrating a partially-completed chip package formed using the conventional heating process of FIG. 2.
Figure 4:
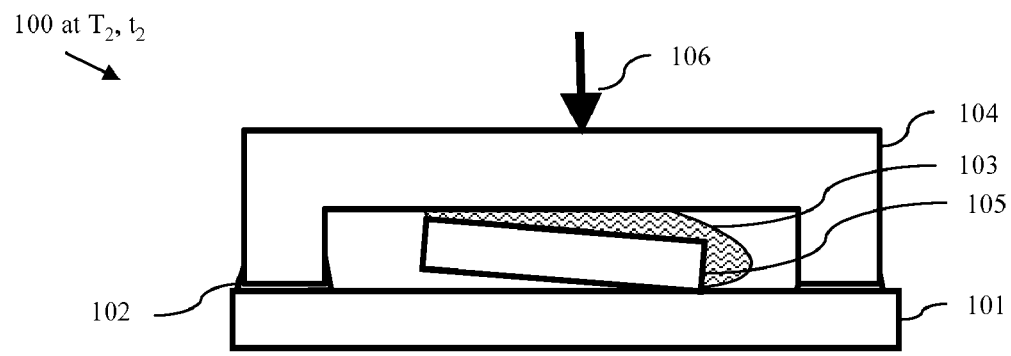
FIG. 4 is a cross-section diagram illustrating a partially-completed chip package formed using the conventional heating process of FIG. 2.
Figure 5:
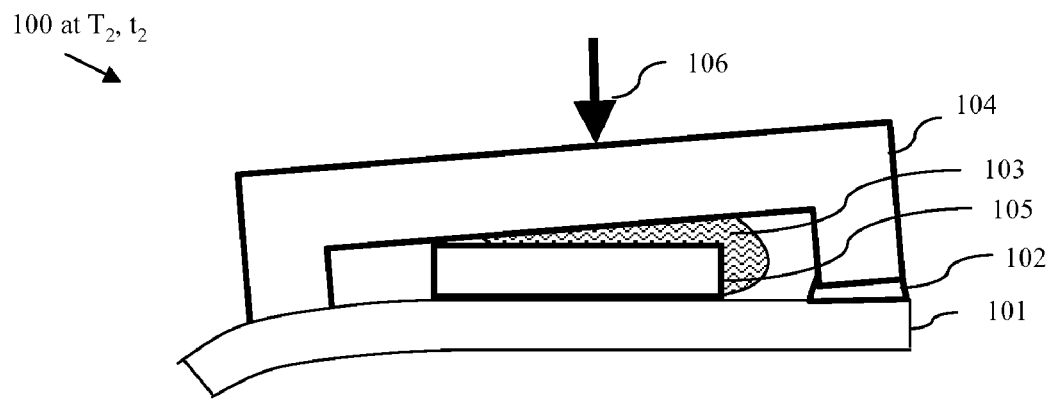
FIG. 5 is a cross-section diagram illustrating a partially-completed chip package formed using the conventional heating process of FIG. 2.
Figure 6:
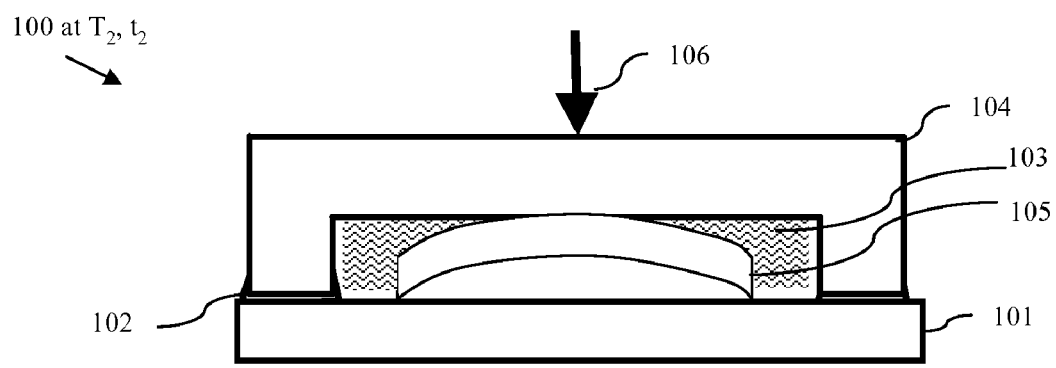
FIG. 6 is a cross-section diagram illustrating a partially-completed chip package formed using the conventional heating process of FIG. 2.

Next, a fixed load 106 (e.g., approximately 10-20 lbf) is place on the chip lid 104 and the chip package 100 is heated directly through the cure temperature ($T_c$) of a sealant 102 to above the reflow (i.e., melting) temperature ($T_m$) of the metal foil 103. Thus, at time ($t_2$) and temperature ($T_2$), the TIM 103 begins to melt and is compressed, while the sealant 102 is still in the process of curing. Consequently, at time ($t_2$) and temperature ($T_2$), the sealant 102 flattens out before it has a chance to cure and the melted TIM 103 is squeezed along the sidewalls of the chip 105 (see FIG. 3). That, is the TIM 103 is no longer registered to the top surface of the chip 105. TIM 103 material along the chip sidewalls will subsequently hinder chip performance. Additionally, those skilled in the art will recognize that chip packages 100 are typically formed with a chip 105 that is tiled or angled with respect to the substrate 101 (e.g., as illustrated in FIG. 4), with a substrate 101 that is cambered or warped (e.g., as illustrated in FIG. 5) and/or with a chip 105 that is cambered or warped (e.g., as illustrated in FIG. 6). Consequently, as illustrated in FIGS. 4-6, at time ($t_2$) and temperature ($T_2$), when the lid 104 is compressed against the TIM 103, the TIM 103 will be squeezed in an unpredictable manner. Thus, the TIM thickness and shape at time ($t_3$) and temperature ($T_3$), when the package is cooled and the TIM is hardened, cannot be predetermined (i.e., it is not predictable and repeatable). If, at the package level, the desired TIM thickness is not achieved, reliable heat dissipation will not occur. Furthermore, if this desired TIM thickness can not be achieved with each chip package produced (i.e., if it is not repeatable), regardless of chip tilt, substrate warpage and/or chip warpage, product performance specifications can not be guaranteed. Therefore, there is a need in the art for an improved electronic package structure as well as a method of forming the structure that incorporates a metal TIM that has a predetermined (i.e., a predictable and repeatable) minimum thickness and that is registered to the top surface of the chip (i.e., that has an essentially symmetric shape and does not extend vertically along the chip sidewalls).

In view of the foregoing disclosed herein are embodiments of electronic package incorporating a thermal interface material (e.g., a metal TIM) between a lid (e.g., a cooling structure) and a chip attached to an organic laminate substrate (e.g., a chip carrier). The TIM has a predetermined (i.e., predictable and repeatable) minimum thickness and is further registered to the top surface of the chip (i.e., the TIM is essentially symmetric in shape and does not extend vertically along the chip sidewalls). Also, disclosed herein are embodiments of a method of forming such an electronic package that uses a hierarchical heating process that cures a lid sealant, thereby securing the lid to the substrate, and then reflows (i.e., melts and cools) the TIM, thereby adhering the TIM to both the chip and lid. This hierarchical heating process ensures that the TIM has the above-mentioned characteristics (i.e., a predetermined minimum thickness and registration to the top surface of the chip) and further provides robust process windows for high-yield, low-cost electronic package manufacturing.

Figure 7:
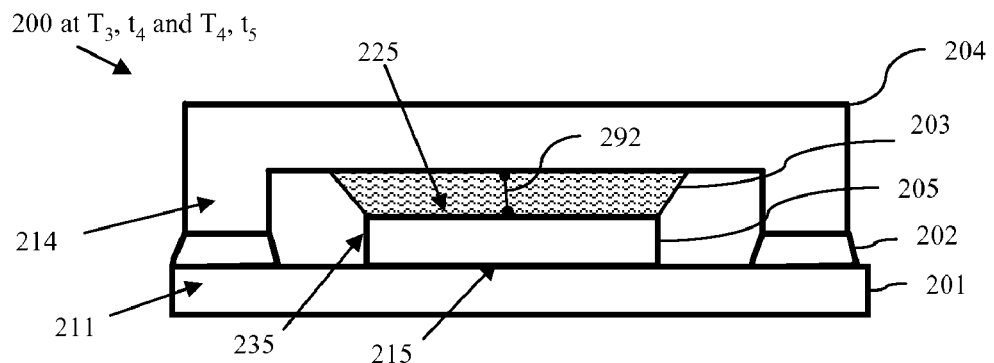
FIG. 7 is a cross-section diagram illustrating an exemplary chip package of the present invention.
Figure 8:
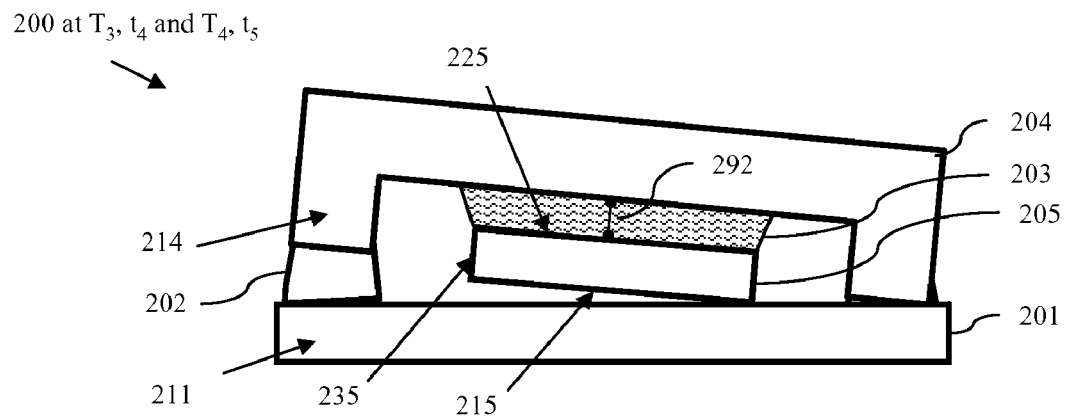
FIG. 8 is a cross-section diagram illustrating another exemplary chip package of the present invention.
Figure 9:
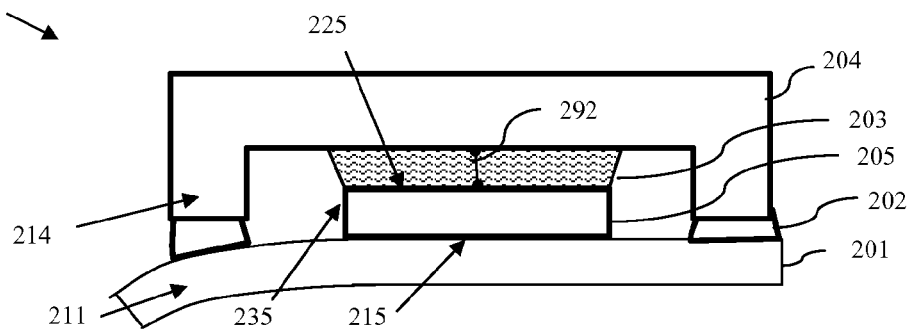
FIG. 9 is a cross-section diagram illustrating another exemplary chip package of the present invention.
Figure 10:
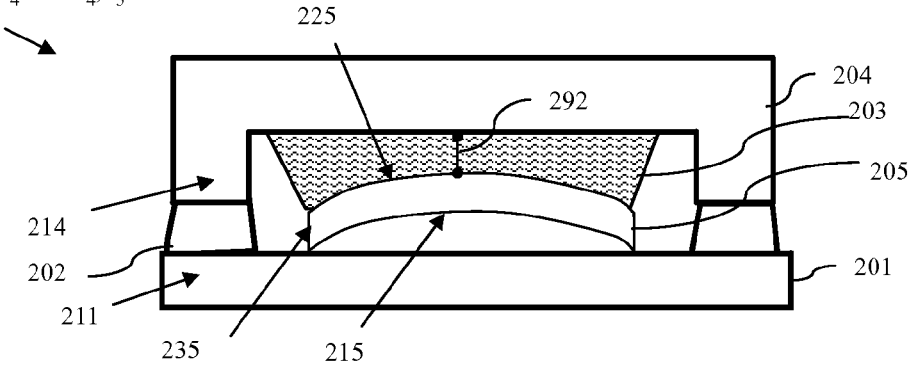
FIG. 10 is a cross-section diagram illustrating another exemplary chip package of the present invention.

More particularly, FIGS. 7-10 illustrate exemplary electronic packages (e.g., chip packages, die packages, semiconductor modules, etc.) according to the present invention. Each electronic package 200 comprises an organic laminate substrate 201 (e.g., a chip carrier), a chip 205 (e.g., a die, an integrated circuit, etc.), a lid 204 (e.g., a cooling structure with or without a heat sink), a thermal interface material 203 (TIM) and a cured sealant 202. In the chip package 200, the chip 205, lid 204 and substrate 201 can all be planar and parallel with respect to each other (as illustrated in FIG. 7). Alternatively, the chip 205 can be angled (i.e., tilted) with respect to the substrate 201 (as illustrated in FIG. 8), the substrate 201 can be cambered or warped (as illustrated in FIG. 9) and/or the chip 205 can be cambered or warped (e.g., as illustrated in FIG. 10).

In any case, the chip 205 can have a bottom surface 215, a top surface 225 opposite the bottom surface and sidewalls 235. The bottom surface 215 of the chip 205 can be electrically and mechanically connected to the substrate 201. For example, the bottom surface 215 of the chip 205 can be connected to the substrate 201 using solder bumps, solder joints or any other suitable means of electrically and mechanically connecting the chip 205 to the substrate 201.

The lid 204 can be positioned above the top surface 225 of the chip 205. The lid 204 and substrate 201 can each comprise outer edges 214 and 211, respectively, which extend laterally beyond the chip sidewalls 235 and are sealed by the sealant 202 (see more detailed discussion below).

The thermal interface material (TIM) 203 can be positioned between and can be adhered to both the lid 204 and the top surface 225 of the chip 205 such that it provides a thermal path from the chip 205 to the lid 204. The TIM 203 is reflowed (i.e., melted and cooled) and has a predetermined minimum thickness 292 (i.e., a repeatable and predictable minimum thickness). Additionally, the TIM 203 is registered to the top surface 225 of the chip 205. That is, the TIM 203 is essentially symmetric in shape and does not extend vertically along the sidewalls 235 of the chip 205. It should be noted that in the case of FIGS. 7-9, where the chip 205 is planar and parallel to the lid 204, the TIM 203 can further have a uniform thickness.

In any case (i.e., in FIGS. 7-10), the chip package 200 can, for example, comprise a TIM 203 that is registered to the top surface 225 of the chip 205 and that has a predetermined minimum thickness 292 of 6 mils. This 6 mil TIM 203 would provide a power dissipation benefit of greater than approximately 10 Watts (e.g., between 10 and 40 Watts) over prior art thermal grease or thermal gel TIM-based chip packages. Finally, the TIM 203 can comprise any suitable solid conductive material, which is capable of being secured to both the chip 205 and lid 204 using a reflow (i.e., a melting and cooling) adhesion process and which has a known reflow (i.e., melting temperature ($T_m$)). For example, the TIM 203 can be formed using an indium, indium alloy or some other suitable metal or metal alloy foil, having a known reflow temperature.

It should be understood that the electronic package 200 can also comprise one or more wetting layers (e.g., gold or gold alloy layers) plated onto the top surface 225 of the chip 205 and/or onto the inner surface of the lid 205 such that the TIM 203 is positioned between the wetting layers. As discussed in U.S. Pat. No. 6,504,242 of Deppisch et al. issued on Jan. 7, 2003 and incorporated herein by reference, a wetting layer (e.g., a gold-plated layer) assists in the attachment of a metal TIM, such as an indium or indium alloy TIM, to the lid and chip in a chip package.

Finally, the sealant 202, which has been cured, can connect the outer edges 214 of the lid 204 to the outer edges 211 of the substrate 201. This sealant 202 can, for example, comprise a cured liquid-dispensed elastomer sealant (e.g., a silicon-based elastomer sealant). The liquid-dispensed elastomer sealant can be pre-selected so that it has a cure temperature ($T_c$) that is less than the known reflow temperature ($T_m$) of the TIM 203. Alternatively, the sealant 202 can comprise a melted, re-shaped and cured pre-formed thermoset sealant (e.g., a pre-formed b-stage epoxy sealant). The pre-formed thermoset sealant can similarly be pre-selected so that it has a cure temperature ($T_c$) that is less than the known reflow temperature ($T_m$) of the TIM 203. The thickness and shape of the sealant 202 along the outer edges 211, 214 of the package 200 may vary in order to accommodate, for example, chip warpage, substrate warpage, chip tilt, etc.

The unique structure of the electronic package 200, as illustrated in FIGS. 7-10, is the result of a hierarchical heating process used during package 200 formation (see detailed discussion of the method embodiments below). Specifically, the sealant 202 and TIM 203 are pre-selected such that the sealant 202 has a cure temperature ($T_c$) that is less than a reflow (i.e., melting) temperature ($T_m$) of the TIM 203. For example, the cure temperature ($T_c$) can be less than approximately 150° C. and the reflow temperature ($T_m$) of the TIM 203 can be greater than approximately 150° C. Unlike the heating process used in prior art metal TIM-based chip package assembly processes, this hierarchical heating process takes advantage of the different curing and melting temperatures of the sealant 202 and TIM 203, respectively, in order to first completely cure the sealant 202 (i.e., re-shape and harden in the case of a liquid-dispensed sealant and melt, re-shape, and harden in the case of a pre-formed thermoset sealant) and, then, to reflow (i.e., melt and cool to harden) the solid conductive material used to form the TIM 203. The predetermined minimum thickness 292 of the TIM 203 and registration of the TIM 203 to the top surface 225 of the chip 205 is dependent upon this hierarchical heating process. That is, if the hierarchical heating method (disclosed below) is used to form the electronic package 200, then the predetermined (i.e., repeatable and predictable) minimum thickness 292 of the TIM 203 will be essentially equal to the pre-reflow thickness of the TIM 203 and registration of the TIM 203 to the top surface 225 of the chip would necessarily occur. Such would be the case, if the chip 205, substrate 201 and lid 204 were all planar and parallel (e.g., as illustrated in FIG. 7). Such would also be the case, even if the chip 205 were angled or tilted with respect to the substrate 201 (e.g., as illustrated in FIG. 8), if the substrate 201 were cambered or warped (e.g., as illustrated in FIG. 9) and/or if the chip 205 were cambered or warped (as illustrated in FIG. 10).

Figure 11:
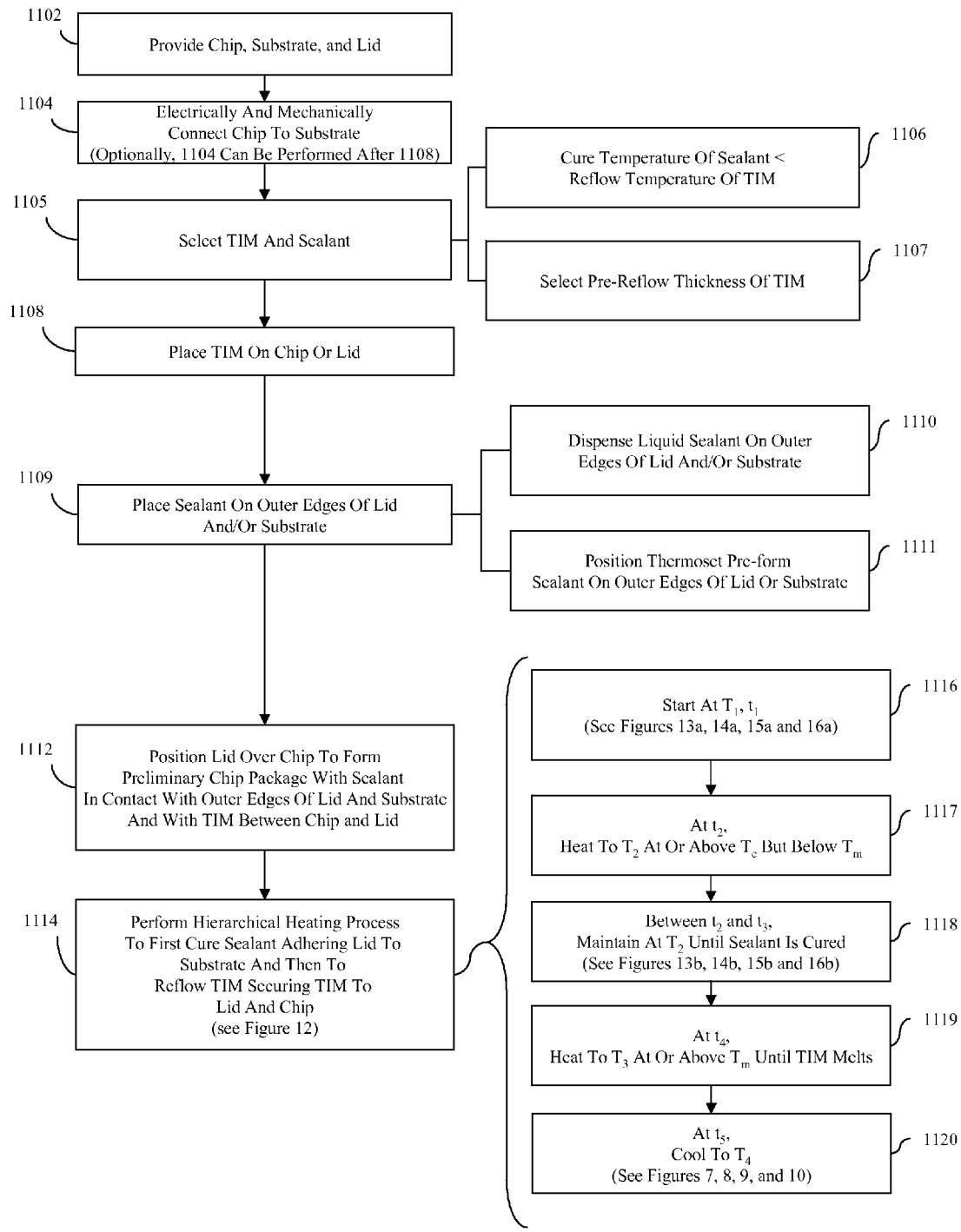
FIG. 11 is a flow diagram illustrating an embodiment of a method of forming the chip packages of FIGS. 7-10.

Referring to FIG. 11, also disclosed are embodiments of a method of forming the electronic package 200, described above and illustrated in the exemplary structures of FIGS. 7-10. The method embodiments incorporate a hierarchical heating process for curing a sealant in order to secure a lid (e.g., a cooling structure) to a substrate (e.g., a chip carrier) and then for reflowing (i.e., melting and cooling) a TIM in order to secure the TIM to both the chip and the lid. This hierarchical heating process ensures that the TIM has a predetermined (i.e., predictable and repeatable) minimum thickness and further that the TIM is registered to the top surface of the chip (i.e., that the TIM has an essentially symmetric shape and does not extend vertically along the sidewalls of the chip).

Specifically, the method embodiments comprise providing a chip (e.g., a die, an integrated circuit, etc.), an organic laminate substrate (e.g., a chip carrier), and a lid (e.g., a cooling structure with or without a heatsink) (1102).

Next, the chip is electrically and mechanically connected to the substrate (1104). This can be accomplished using conventional chip-to-chip carrier attachment techniques (e.g., using solder joints between the bottom surface of the chip and the top surface of the substrate).

Then, a TIM material and a sealant are selected (1105). Specifically, a TIM, which is capable of being secured to both the chip and lid using a reflow (i.e., a melting and cooling) adhesion process, is selected. For example, the selected TIM can comprise a solid conductive material, such as a metal (e.g., indium, an indium allow or any other suitable material). The TIM that is selected will have a known reflow temperature ($T_m$), for example, that is be greater than approximately 150° C. Additionally, the TIM that is selected will have a known (i.e., pre-selected) pre-reflow TIM thickness (e.g., of approximately 6 mils) (1107).

As mentioned above, a sealant is also selected. The sealant that is selected will have a cure temperature ($T_c$) that is less than the known reflow temperature ($T_m$) of the TIM (1106). In one embodiment, a liquid-dispensed elastomer sealant (e.g., a silicon-based elastomer sealant) can be selected. This liquid sealant is selected so that it has a cure temperature ($T_c$) that is less than the known reflow temperature ($T_m$) of the TIM. In another embodiment, a pre-formed thermoset sealant (e.g., a pre-formed b-stage epoxy sealant) can be selected. This pre-formed thermoset sealant is selected so that it has both a melt-to-reshape temperature and a cure temperature ($T_c$) that are less than the known reflow temperature ($T_m$) of the TIM. Once the TIM and sealant are selected, the selected TIM can be placed (e.g., as a metal foil) on either the top surface of the chip or the inner surface of a lid (1108).

The exemplary method steps, discussed above, describe the chip 205 as being mounted on the substrate 201 (at process 1104), prior to TIM 203 and sealant 202 selection (at process 1105) and prior to placing the TIM 203 on the chip 205 and/or the lid 204 (at process 1108). However, those skilled in the art will recognize that the chip 205 may, alternatively, be mounted on the substrate 201 (at process 1104), after TIM 203 placement (at process 1108). It should also be understood that one or more wetting layers (e.g., gold or gold alloy layers) can be plated onto the top surface 225 of the chip 205 and/or onto the inner surface of the lid 205 prior to TIM placement 203 (at process 1108). As discussed in U.S. Pat. No. 6,504,242 of Deppisch et al. issued on Jan. 7, 2003 and incorporated herein by reference, a wetting layer (e.g., a gold-plated layer) assists in the attachment of a metal TIM, such as an indium or indium alloy TIM, to the lid and chip in a chip package.

Next, the selected sealant can be placed on the lid and/or substrate (1109). That is, a selected liquid sealant can be dispensed on the outer edges of either the lid and/or the substrate (1110). Then, the lid can be positioned above the top surface of the chip such that the liquid sealant wets the outer edges of both the lid and the substrate and further such that the TIM is between the lid and the top surface of the chip (1112). Alternatively, a selected pre-formed thermoset sealant can be placed on the outer edges of the lid or the substrate (1111). Then, the lid can be positioned above the top surface of the chip such that the pre-formed thermoset sealant is in contact with both the lid and the substrate and further such that the TIM is between the lid and the top surface of the chip (1112).

Figure 13A:
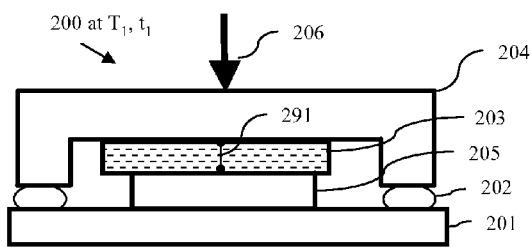
FIGS. 13a-b are cross-section diagrams illustrating the hierarchical heating process of FIG. 12 used to form the structure of FIG. 7.
Figure 14A:
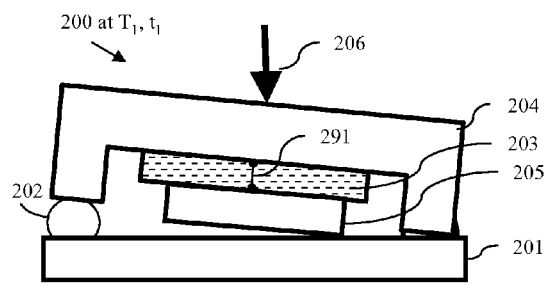
FIGS. 14a-b are cross-section diagrams illustrating the hierarchical heating process of FIG. 12 used to form the structure of FIG. 8.
Figure 15A:
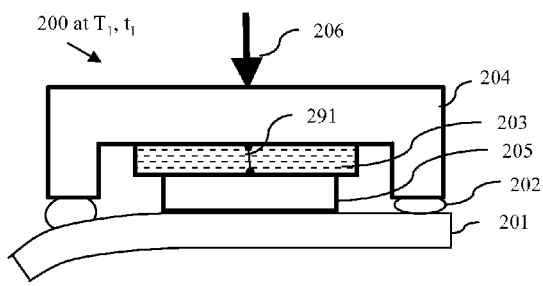
FIGS. 15a-b are cross-section diagrams illustrating the hierarchical heating process of FIG. 12 used to form the structure of FIG. 9.
Figure 16A:
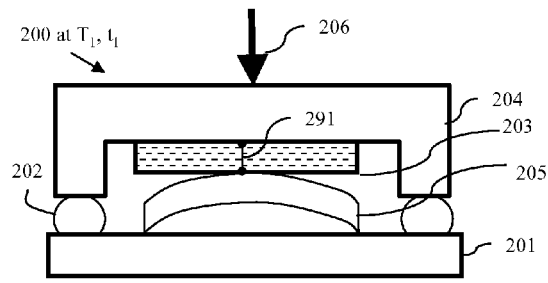
FIGS. 16a-b are cross-section diagrams illustrating the hierarchical heating process of FIG. 12 used to form the structure of FIG. 7.

Specifically, as illustrated in FIGS. 13a, 14a, 15a and 16a (at process 1112) the lid 204 is positioned above and essentially parallel to the top surface 225 of the chip 205 such that the sealant 202, which is in an un-cured state, wets/contacts the outer edges 214 and 211, respectively, of both the lid 204 and substrate 201 and such that the TIM 203, which is in its non-reflowed state, is between the lid 204 and the top surface 225 of the chip 25. Then, a fixed load 206 (e.g., an approximately 10-20 lbf) can be place on the chip lid 204 to ensure that the TIM 203 remains in contact with an essentially parallel to the chip surface 225, during subsequent processing. Such would be the case, if the chip 205, substrate 201 and lid 204 were all planar and parallel (e.g., as illustrated in FIG. 13a). Such would also be the case, even if the chip 205 were angled or tilted with respect to the substrate 201 (e.g., as illustrated in FIG. 14a), if the substrate 201 were cambered or warped (e.g., as illustrated in FIG. 15a) and/or if the chip 205 were cambered or warped (as illustrated in FIG. 16a). Those skilled in the art will recognize that the use of such a continuous fixed load 206 may negate the need for a wetting layer (discussed above).

Figure 12:
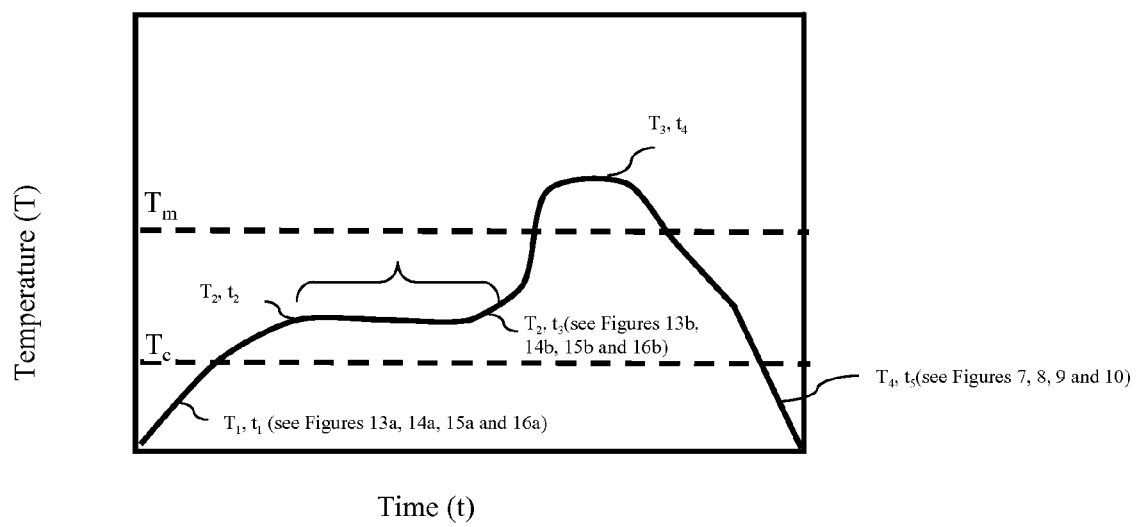
FIG. 12 is a graph illustrating a hierarchical heating process used in forming the chip packages of FIG. 7-10.

Once the lid 204 and load 206 are in place, a hierarchical heating process is performed first to cure the sealant 202, thereby sealing the lid 204 to the substrate 201, and second to reflow the TIM 203, thereby adhering the TIM 203 to both the lid 204 and the chip 205 (1114). More specifically, referring to FIG. 12, the hierarchical heating process begins with a preliminary (i.e., unsealed) chip package structure at an initial temperature $T_1$ and time $t_1$ (1116, see, for example, FIGS. 13a, 14a, 15a and 16a). In the case of a liquid-dispensed sealant, this initial temperature $T_1$ would be less than the cure temperature ($T_c$) of the sealant 202. In the case of a pre-formed thermoset sealant, this initial temperature $T_1$ would be less than both the melt-to-reshape temperature and the cure temperature ($T_c$) of the sealant 202.

Figure 13B:
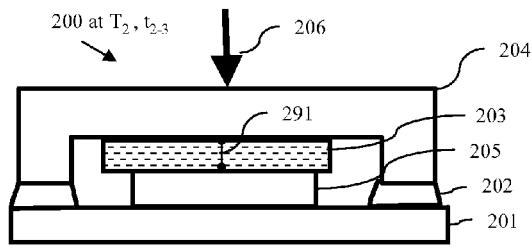
Figure 14B:
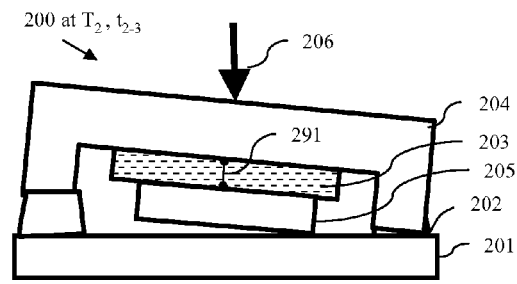
Figure 15B:
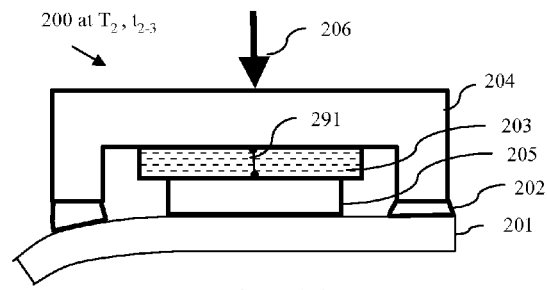
Figure 16B:
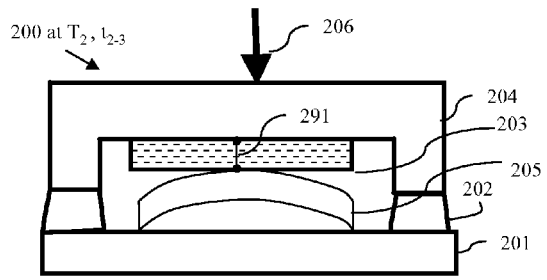

Next at time $t_2$, the electronic package 200 is heated to a first predetermined temperature $T_2$ that is above the cure temperature ($T_c$) of the sealant 202, but below the known reflow temperature ($T_m$) of the TIM 203 (1117). Between time $t_2$ and time $t_3$, the electronic package 200 is maintained at the first predetermined temperature $T_2$ until the sealant 202 is cured. That is, the electronic package 200 is maintained at the first predetermined temperature $T_2$ until a liquid-dispensed elastomer sealant is hardened or until a pre-formed thermoset sealant is melted, reshaped and hardened (1118). Curing the sealant between time $t_2$ and time $t_3$, while the TIM 203 is still in a solid form, ensures that the lid 204 remains registered to the top surface 225 of the chip 205 and that the minimum distance between the chip 205 and lid 204 remains constant (i.e., remains equal to the pre-reflow thickness 291 of the TIM 203). Such would be the case, if the chip 205, substrate 201 and lid 204 were all planar and parallel (e.g., as illustrated in FIG. 13b). Such would also be the case, even if the chip 205 were angled or tilted with respect to the substrate 201 (e.g., as illustrated in FIG. 14b), if the substrate 201 were cambered or warped (e.g., as illustrated in FIG. 15b) and/or if the chip 205 were cambered or warped (as illustrated in FIG. 16b). That is, when the sealant 202 is curing between time $t_2$ and time $t_3$, the TIM 203 remains solid because the temperature $T_2$ is below the TIM reflow temperature ($T_m$). Also during this time period $t_2$-$t_3$, the sealant 202 is re-shaped and hardened to accommodate any variations in chip shape (e.g., a warped or cambered chip), any variations in substrate shape (e.g., a warped or cambered substrate) and/or any tilt in the chip with respect to the substrate. This, in combination with the fixed load 206, allows the lid 204 to remain approximately parallel to chip 205 and to remain separated from the chip by the pre-reflow thickness 291 of the TIM 203. Once the sealant 202 is cured at time $T_3$, it can not be melted or reshaped.

Then, at time $t_4$ (i.e., after the sealant 202 is cured), the electronic package 200 is heated to a second predetermined temperature $T_3$ that is higher than the first predetermined temperature $T_2$ and, more specifically, that is at least equal to the reflow temperature ($T_m$) of the TIM 203 (1119). Reflowing the TIM 203 after curing the sealant 202, allows the TIM 203 to adhere to both the lid 204 and the chip 205 and further ensures that the TIM 203 has a predetermined minimum thickness 292 and is registered to the top surface 225 of the chip 205 such that it is essentially symmetric in shape and does not extend vertically along the sidewalls 215 of the chip 205. Such would be the case, if the chip 205, substrate 201 and lid 204 were all planar and parallel (e.g., as illustrated in FIG. 7). Such would also be the case, even if the chip 205 were angled or tilted with respect to the substrate 201 (e.g., as illustrated in FIG. 8), if the substrate 201 were cambered or warped (e.g., as illustrated in FIG. 9) and/or if the chip 205 were cambered or warped (as illustrated in FIG. 10). That is, as the TIM 203 melts at time $t_4$ and temperature $T_3$, it fills this space between the lid 204 and chip 204. However, since the lid 204 is secured to the substrate 201, the minimum distance 292 between the top surface 225 of the chip 205 and the lid 204 remains constant and equal to the known pre-reflow thickness 291 (see FIGS. 13a-b, 14a-b, 15a-b and 16a-b) of the TIM 203. It should be understood that since the sealant 202 is hardened, this minimum distance remains constant regardless of any load 206 exerted on the top surface 225 of the lid 204. Consequently, although the TIM 203 melts at time $t_4$ and temperature $T_3$, it is not squeezed so it does not flow over the sidewalls 215 of the chip 205 (i.e., it will not extend vertically along the sidewalls 215 of the chip 205). So, for example, if the pre-reflow thickness 291 of the TIM 203 were 6 mils, then the post-reflow minimum thickness 292 of the TIM 203 would also be 6 mils.

At time $t_5$, once the TIM 203 has melted and fills space between the chip 205 and lid 204, the chip package 200 is cooled back to a temperature $T_4$ below the second predetermined temperature $T_3$ allowing the TIM 203 to re-hardens such that it is adhered to both the lid 204 and the top surface 225 of the chip 205 and further such that it keeps the predetermined minimum thickness 292 and registration to the top surface 225 of the chip 205. A chip package 200 with a TIM 203 that is registered to the top surface 225 of the chip 205 and that has a predetermined minimum thickness 292 of 6 mils would provide a power dissipation benefit of greater than approximately 10 Watts (e.g., between 10 and 40 Watts) over prior art thermal grease or thermal gel TIM-based chip packages.

Therefore, disclosed above are embodiments of electronic package incorporating a thermal interface material (e.g., a metal TIM) between a lid (e.g., a cooling structure) and a chip attached to a substrate (e.g., a chip carrier). The TIM has a predetermined (i.e., repeatable) minimum thickness and is further registered to the top surface of the chip (i.e., the TIM is essentially symmetric in shape and does not extend vertically along the sidewalls of the chip). Also, disclosed herein are embodiments of a method of forming such an electronic package that uses a hierarchical heating process that cures a lid sealant, thereby securing the lid to the substrate, and then reflows (i.e., melts and cools) the TIM, thereby adhering the TIM to both the chip and lid. This hierarchical heating process ensures that the TIM has the above-mentioned characteristics (i.e., a predetermined minimum thickness and registration to the top surface of the chip) and further provides robust process windows for high-yield, low-cost electronic package manufacturing.

The foregoing description of the specific embodiments will so fully reveal the general nature of the invention that others can, by applying current knowledge, readily change, adapt, and/or modify for various applications such specific embodiments without departing from the generic concept. It is further to be understood that the phraseology or terminology employed herein is for the purpose of description and not of limitation. Therefore, those skilled in the art will recognize that the embodiments of the invention can be practiced with changes, adaptations and modifications within the spirit and scope of the appended claims and such changes, adaptations and modifications should and are intended to be comprehended within the meaning and range of equivalents of the disclosed embodiments.

What is claimed is:

1. A chip package comprising:
   a substrate;
   a chip having a bottom surface, a top surface opposite said bottom surface and sidewalls, wherein said bottom surface is connected to said substrate;
   a lid above said top surface of said chip, said lid and said substrate each comprising outer edges extending laterally beyond said chip;
   a cured sealant connecting said outer edges of said lid to said outer edges of said substrate; and
   a metal thermal interface layer between and adhered to said lid and said top surface of said chip, said metal thermal interface layer comprising one of a metal foil and a metal alloy foil, having a predetermined minimum thickness and being registered to said top surface of said chip without extending vertically along said sidewalls of said chip,
   at least one of said chip being angled relative to said substrate such that said chip and said substrate are non-parallel, said substrate being warped such that said substrate is non-planar, and said chip being warped such that said chip is non-planar,
   at least one of said sealant and said metal thermal interface layer having a non-uniform thickness, and
   said sealant having a cure temperature that is less than a reflow temperature of said one of said metal foil and said metal alloy foil.

2. A chip package comprising:
   a substrate;
   a chip having a bottom surface, a top surface opposite said bottom surface, and sidewalls, said substrate and said chip being essentially planar and said bottom surface of said chip being connected to said substrate with such that said chip angled relative to said substrate such that said chip and said substrate are non-parallel;
   a lid above said top surface of said chip, said lid and said substrate each comprising outer edges extending laterally beyond said chip;
   a cured sealant connecting said outer edges of said lid to said outer edges of said substrate, said sealant having a non-uniform thickness; and
   a metal thermal interface layer between and adhered to said lid and said top surface of said chip, said metal thermal interface layer comprising one of a metal foil and a metal alloy foil, having a predetermined minimum thickness and being registered to said top surface of said chip without extending vertically along said sidewalls of said chip and, said sealant having a cure temperature less than a reflow temperature of said one of said metal foil and said metal alloy foil.

3. A chip package comprising:

a substrate;

a chip having a bottom surface, a top surface opposite said bottom surface, and sidewalls, said substrate being warped such that said substrate is non-planar, said chip being essentially planar and said bottom surface of said chip being connected to said substrate such that said chip and said substrate are non-parallel;

a lid above said top surface of said chip, said lid and said substrate each comprising outer edges extending laterally beyond said chip;

a cured sealant connecting said outer edges of said lid to said outer edges of said substrate, said sealant having a non-uniform thickness; and a metal thermal interface layer between and adhered to said lid and said top surface of said chip, said metal thermal interface layer comprising one of a metal foil and a metal alloy foil, having a predetermined minimum thickness and being registered to said top surface of said chip without extending vertically along said sidewalls of said chip, and said sealant having a cure temperature less than a reflow temperature of said one of said metal foil and said metal alloy foil.

4. A chip package comprising:

a substrate;

a chip having a bottom surface, a top surface opposite said bottom surface, and sidewalls, said substrate being essentially planar, said chip being warped such that said chip is non-planar and said bottom surface of said chip being connected to said substrate such that said chip and said substrate are non-parallel;

a lid above said top surface of said chip, said lid and said substrate each comprising outer edges extending laterally beyond said chip;

a cured sealant connecting said outer edges of said lid to said outer edges of said substrate, said sealant having an essentially uniform thickness; and a metal thermal interface layer between and adhered to said lid and said top surface of said chip, said metal thermal interface layer comprising one of a metal foil and a metal alloy foil, having a non-uniform thickness, having a predetermined minimum thickness and being registered to said top surface of said chip without extending vertically along said sidewalls of said chip, and said sealant having a cure temperature less than a reflow temperature of said one of said metal foil and said metal alloy foil.

5. The chip package according to claim 1, said predetermined minimum thickness of said metal thermal interface layer being essentially equal to a pre-reflow essentially uniform thickness of said one of said metal foil and said metal alloy foil.

6. The chip package according to claim 1, said sealant comprising a melted, re-shaped and cured thermoset sealant, said melted, re-shaped and cured thermoset sealant comprising a b-staged epoxy pre-form sealant.

7. The chip package according to claim 1, said sealant comprising a liquid-dispensed elastomer sealant.

8. The chip package according to claim 1, said metal thermal interface layer having an essentially symmetrical shape.

9. The chip package according to claim 2, said predetermined minimum thickness of said metal thermal interface layer being essentially equal to a pre-reflow essentially uniform thickness of said one of said metal foil and said metal alloy foil.

10. The chip package according to claim 2, said sealant comprising a melted, re-shaped and cured thermoset sealant.

11. The chip package according to claim 10, said melted, re-shaped and cured thermoset sealant comprising a b-staged epoxy pre-form sealant.

12. The chip package according to claim 2, said sealant comprising a liquid-dispensed elastomer sealant.

13. The chip package according to claim 2, said metal thermal interface layer having an essentially symmetrical shape with an essentially uniform thickness.

14. The chip package according to claim 3, said predetermined minimum thickness of said metal thermal interface layer is essentially equal to a pre-reflow essentially uniform thickness of said one of said metal foil and said metal alloy foil.

15. The chip package according to claim 3, said sealant comprising a melted, re-shaped and cured thermoset sealant comprising a b-staged epoxy pre-form sealant.

16. The chip package according to claim 3, said sealant comprising a liquid-dispensed elastomer sealant.

17. The chip package according to claim 3, said metal thermal interface layer having an essentially symmetrical shape with an essentially uniform thickness.

18. The chip package according to claim 4, said predetermined minimum thickness of said metal thermal interface layer is essentially equal to a pre-reflow essentially uniform thickness of said one of said metal foil and said metal alloy foil.

19. The chip package according to claim 4, said sealant comprising one of the following:
   a melted, re-shaped and cured thermoset sealant comprising a b-staged epoxy pre-form sealant; and
   a liquid-dispensed elastomer sealant.

20. The chip package according to claim 4, said metal thermal interface layer having an essentially symmetrical shape.

* * * * *